United States Patent [19]

Christou

[11] 4,179,604

[45] Dec. 18, 1979

[54] ELECTRON COLLECTOR FOR FORMING LOW-LOSS ELECTRON IMAGES

[75] Inventor: Aristos Christou, Springfield, Va.

[73] Assignee: The United States of America as represented by the Secretary of the Navy, Washington, D.C.

[21] Appl. No.: 946,986

[22] Filed: Sep. 29, 1978

[51] Int. Cl.² .............................................. H01J 39/00
[52] U.S. Cl. ...................................... 250/305; 250/310
[58] Field of Search ................................ 250/305, 310

[56] References Cited

U.S. PATENT DOCUMENTS

| 3,582,649 | 6/1971 | Taylor | 250/305 |
| 3,760,180 | 9/1973 | Weber | 250/305 |

Primary Examiner—Harold A. Dixon
Attorney, Agent, or Firm—R. S. Sciascia; Philip Schneider; William C. Daubenspeck

[57] ABSTRACT

In a scanning electron beam system wherein a primary beam of electrons is scanned over the surface of a specimen and electron images are generated by collecting electrons scattered from the surface, an improved electron collector for selectively collecting the primary electrons that have suffered low loss in being scattered by the surface. Three symmetrically shaped mesh grids are arranged in front of a scintillator in the path of the backscattered electrons. The grids are disposed relative to each other and biased so that the electric fields permit passage of electrons within a narrow energy range. The scintillator is coated with a layer of tantalum and a layer of gold to provide thermal stability and resistance to damage from bombardment by high-energy electrons.

10 Claims, 4 Drawing Figures

ELECTRON COLLECTOR FOR FORMING LOW-LOSS ELECTRON IMAGES

BACKGROUND OF THE INVENTION

This invention relates generally to scanning electron beam systems and, more particularly, the apparatus for selectively collecting low-loss electrons backscattered from a specimen for forming low-loss electron images in such systems.

In a scanning electron beam system, a primary electron beam is directed at a particular point on the surface of a specimen in a vacuum. The electron beam penetrates the surface to a depth determined by the beam energy and the angle of incidence between the axis of the beam and the surface. As the beam travels along its path in the specimen, electrons are emitted from the specimen. These electrons may be secondary electrons ejected from the outer shells of atoms which have been excited by the primary beam or electrons from the primary beam which have been backscattered from the specimen. A portion of the backscattered electrons from the primary beam has suffered very little loss in energy because the electrons in this portion, herein referred to as low-loss electrons, have penetrated the surface only a short distance before being backscattered. Electron images formed by monitoring the low-loss electrons as the primary beam is scanned in a raster pattern over the surface are very useful in analyzing the topography and texture of the surface.

In order to obtain the most detailed images, it is required to selectively collect the low-loss electrons having energies within a narrow energy range. Heretofore, apparatus for collecting low-loss electrons included one or two retarding grids which were placed in the path of the backscattered electrons between the specimen and an electron detector (such as a scintillator-light pipe-photomultiplier tube arrangement) to filter electrons other than the low-loss electrons. These collector system, in addition to providing relatively limited energy discrimination, provided poor transmission of the low-loss electrons due to the presence of retarding and accelerating fields on either side of the grids. Signal losses and poor signal-to-noise ratios resulted from extraneous collisions and deflections out of the solid angle of the collector system. The effect of the poor signal-to-noise ratio may be partially overcome by use of accelerating potentials of over 20 KeV for the primary beam; however, this large accelerating potential results in damage to the specimen. In addition, the scintillators used in prior collector systems were not thermally stable and were subject to degradation from bombardment of the high-energy electrons.

SUMMARY OF THE INVENTION

It is an object of the present invention to provide improved apparatus for collecting low-loss electrons emitted from a specimen during scanning of the specimen by an electron beam.

It is another object of the present invention to provide an electron collector for low-loss electrons having improved energy discrimination and improved electron transmission.

It is a further object of the present invention to provide an electron collector for low-loss electrons, which is thermally stable and is not degraded by bombardment by high-energy electrons.

An electron collector according to the present invention includes three closely-spaced mesh grids and a scintillator disposed in the path of the emitted electrons. The biasing of the grids determines the energy range of the electrons which are permitted to pass through the grids and strike the scintillator. The scintillator is coated with a first layer of tantalum and a second layer of gold to provide a thermally stable device which is not degraded when bombarded by high-energy electrons.

Other objects, advantages, and novel features of the invention will become apparent from the following description when considered in conjunction with the accompanying drawings wherein:

DESCRIPTION OF THE PREFERRED EMBODIMENT

Before referring to the Figures, it is noted that in order to illustrate the invention most clearly, the conventional scanning electron beam system with which it is associated is described in the most rudimentary form. The well-known components and assemblies of the scanning electron beam system are described only to the extent necessary to provide an understanding of the invention.

Figure 1:
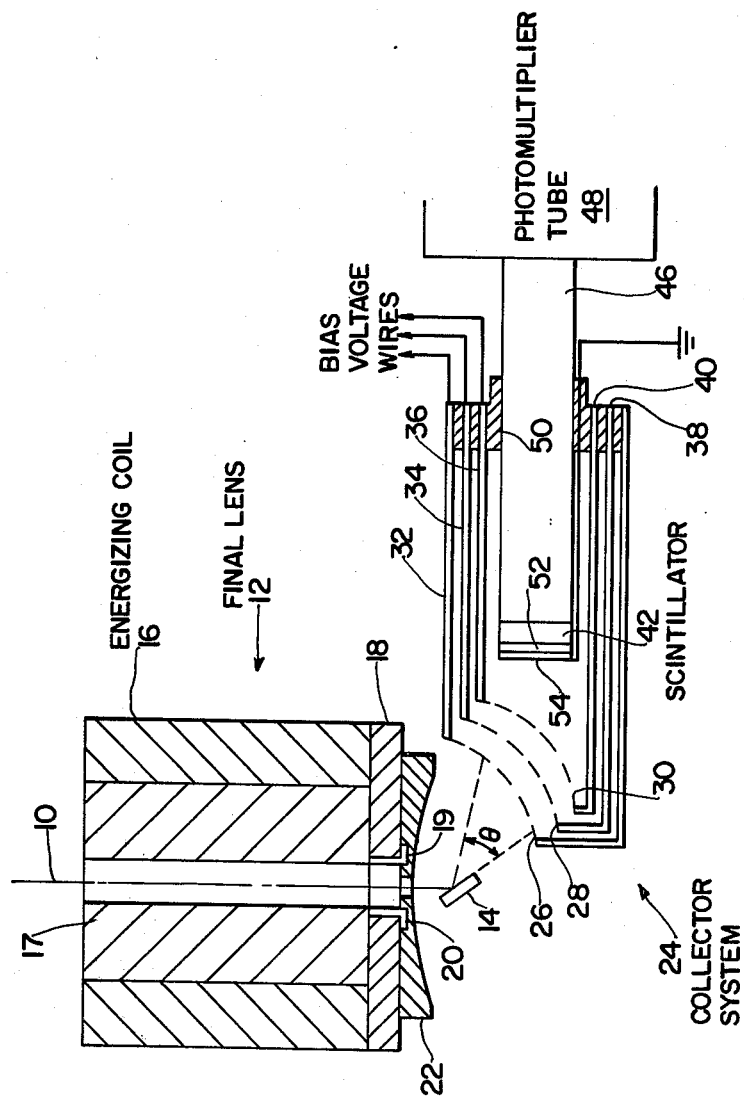
FIG. 1 is a cross-sectional view of an embodiment of the present invention as employed with a scanning electron beam system.

FIG. 1 shows an embodiment of the present invention as employed with a conventional scanning electron beam system such as a scanning electron microscope. In the conventional scanning electron beam system, an electron beam source (not shown), such as a heated cathode, generates a small cross-sectional-area primary beam 10 of the electrons at a selectable energy, generally from 1 KeV to 50 KeV. A focusing means, such as magnetic-focusing lens 12, focuses the primary electron beam 10 from the beam source onto the surface of a specimen 14 mounted on a specimen platform (not shown). The illustrated magnetic-focusing lens 12 includes an energizing coil 16, magnetic core 17 and pole piece 18. Typically the specimen platform is provided with suitable mechanical connections for enabling independent movement of the platform in the x, y, and z directions and tilting and rotation about the x-y plane and the z-axis (the z-axis being parallel to the direction of the primary beam 10). Scanning coils 19 and 20 secured by aperture holder 22 deflect the primary beam 10 in the x-y plane to effect scanning over the surface of the specimen 14. The scanning of the specimen is synchronized with the scanning of a display means (not shown), such as a cathode ray tube, and the intensity of the display means is modulated by a signal proportional to the number of electrons of a particular type (for example, secondary electrons, backscattered electrons or low-loss electrons) which are emitted from the surface in response to the primary beam 10.

The reference numeral 24 designates an embodiment according to the present invention of a system for selectively collecting the emitted electrons within a specific energy range to form the modulation signal. The collector system 24 may be used to collect secondary and backscattered electrons, but it is particularly useful in collecting low-loss electrons for forming low-loss images of the specimen surface. It is noted that a scanning electron beam system is usually required to be easily adaptable for a variety of analytical techniques such as x-ray emission analysis or Auger Electron Spectroscopy and, therefore, several different collector systems are usually incorporated in a single scanning system. The physical dimensions of the apparatus will accordingly place limitations on shape and size of any collector system. The embodiment shown in FIG. 1 was designed for a specific scanning system and was influenced by such considerations.

The collector system 24 which is disposed in the path of the emitted low-loss electrons includes a first mesh grid 26, a second mesh grid 28, and a third mesh grid 30. The three grids 26, 28, and 30 are formed from an electrical conductor and are attached by conducting means (not shown) to cylindrically shaped conducting supports 32, 34, and 36, respectively. The supports 32, 34, and 36 which are separated by annular spacers 38 and 40 of electrically insulating material provide mechanical support for the grids to maintain them in the desired positions relative to each other and the specimen and also provide means for applying a biasing voltage to each grid. In the operative embodiment shown in FIG. 1, the grids 26, 28 and 30 are of nickel and are welded to the conducting supports 32, 34, and 36 which are of stainless steel.

The grids 26, 28, and 30 are shaped in the form of sections of the side walls of circular cylinders and have the same center of curvature so that the second grid 28 is uniformly spaced from the first grid 26 and the third grid 30 is uniformly spaced from the second grid 28. The grids are positioned in the path of the low-loss electrons (the path is a solid angle indicated by angle $\theta$) and should be large enough in surface area so that the expected trajectories of the emitted low-loss electrons are within the solid angle between the first grid 26 and the point of incidence of the primary beam 10 on the specimen 14. It is noted that the grids may be formed in shapes other than circular cylindrical sections such as spherical sections or may even be flat so long as the uniform spacing between the grids is maintained and the solid angle coverage is sufficient.

The previously noted physical constraints of the scanning electron beam system limit the solid angle covered by the first grid 26. In general, the first grid should be close to the specimen 14 so that the low-loss electrons intercepted by the grid have nearly straight-line trajectories (i.e., not significantly deflected by the various fields in the apparatus) but should be spaced from the specimen so that any fields associated with the first grid 26 drop out at the specimen 14. The distance between the first grid 26 and the second grid 28 and the distance between second grid and the third grid 30 is determined by the electric fields placed on the grids. In general, the spacing is selected to prevent accelerating or decelerating fields which vary the energy of the low-loss electrons and degrade the resolution of the collector system. In the operative embodiment of FIG. 1, the first grid 26, second grid 28 and third grid 30 have radii of curvature of approximately 15, 19 and 22 millimeters, respectively, and the first grid is disposed approximately 1.2 to 1.9 cm from the point of incidence of the beam 10 on the specimen 14. The dimensions of the operative embodiment and the electric potentials which are applied to the grids to provide the electric fields are discussed more fully hereinafter during the description of the operation of the invention.

The size of the mesh used for the grids 26, 28 and 30 is an important consideration in the obtaining the best low-loss electron image with the present invention. The mesh must be small enough to provide a uniform electric field—too large a mesh will produce overlapping and penetrating fields which will accelerate and decelerate the electrons non-uniformly, thereby decreasing the energy resolution of the collector system. However, the mesh must be large enough to permit the transmission of enough low-loss electrons to form an image having sufficient contrast. A mesh in the range of 200–400 has been found to be satisfactory for use as grids 26, 28, and 30.

An electron-responsive means such as scintillator 42 is disposed behind the third grid 30 (on the side opposite the specimen 14) and is secured to a light pipe 46 which is coupled to a photomultiplier tube 48. The scintillator/light pipe assembly is disposed within cylindrical support 36 and is mechanically supported therein and electrically isolated therefrom by an annular support 50. The side of the scintillator 42 facing the third grid 30 is coated with a first layer 52 of refractory metal such as tantalum. The first layer 52 is covered by a second layer 54 of a highly electrically conductive noble metal such as gold. In the operative embodiment the first layer 52 is a layer of tantalum 100–300 Å in thickness while the second layer 54 is a layer of gold 1000 Å in thickness. In the past, the scintillators 42 were coated with a layer of aluminum which tended to be degraded by bombardment of high-energy electrons. The use of tantalum layer 52 and gold layer 54 provides a means to control the bias of the scintillator 42 (which is typically of non-conductive material) and provides a detector which is stable under radiation bombardment and temperature changes.

The scintillator 42 is disposed to accept as many of the electrons passing through the three grids as possible. It should be apparent that all of the low-loss electrons will not strike the surface of the flat scintillator 42 so that the contrast of the image will be somewhat degraded. A flat scintillator is used in the operative embodiment because physical constraints of the scanning system and cost considerations detract from the use of a curvilinear scintillator having greater angular coverage which would provide improved operation.

Figure 2:
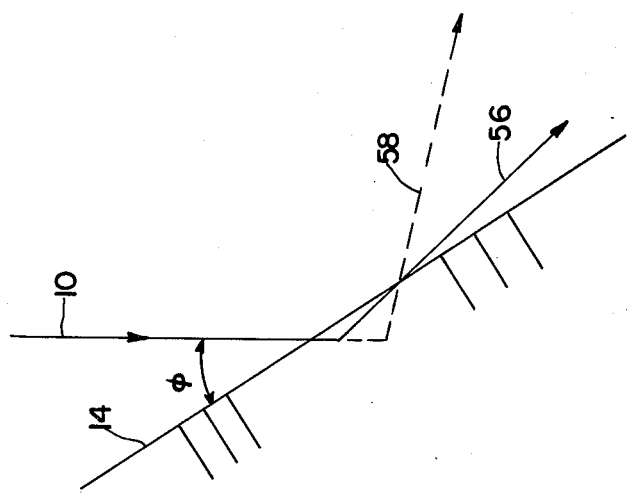
FIG. 2 illustrates the backscattering of low-loss electrons when a high-energy electron beam is incident on a specimen.

The operation of the present collector system for low-loss electrons will now be described. Referring now to FIG. 2, there is shown a specimen 14 having its surface orientated at an angle $\phi$ with respect to the axis of a primary electron beam 10 which is incident thereon. The beam 10 will typically have an energy of from 10 KeV to 15 KeV and the specimen 14 will be at ground potential. Some of the incident electrons 10 will penetrate the surface only a short distance and be backscattered as low-loss electrons over path 56; others will penetrate a greater distance and, after suffering a greater loss, will be backscattered over path 58.

Figure 3:
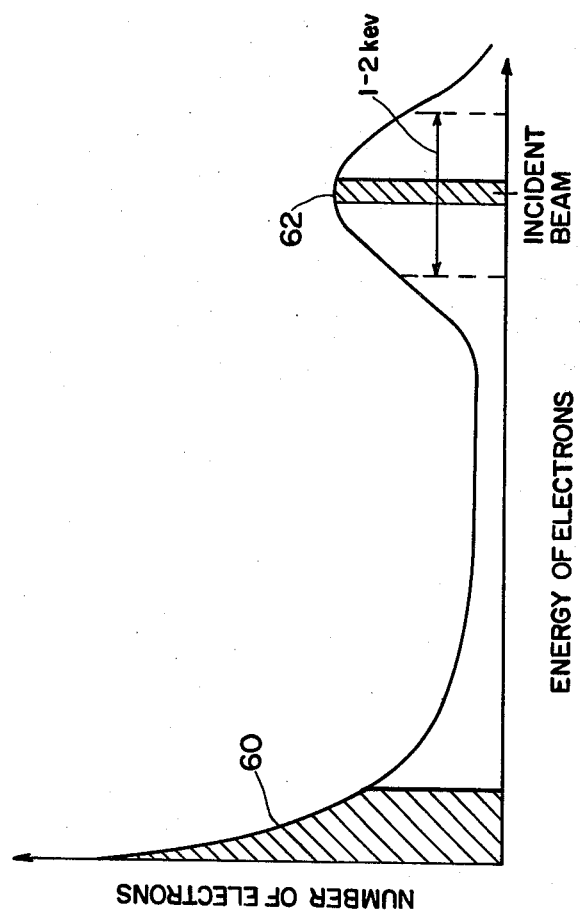
FIG. 3 illustrates the energy distribution of the electrons emitted when a high-energy electron beam is incident on a specimen.

The number of low-loss electrons backscattered varies inversely as the angle $\phi$ and FIG. 3 shows a typical energy distribution for electrons emitted from the surface as a result of the incident beam. It can be seen that there are a large number of low-energy secondary electrons emitted (as shown by region 60) and a large number of electrons backscattered in a Gaussian distribution having a spread of 1–2 KeV around the energy of the incident beam 10. In general, secondary electrons, low-loss electrons, and backscattered electrons other than low-loss electrons are emitted along paths within a solid angle, the latter extending between the point of incidence of the primary beam and the first grid 26 of the collector system 24. It is the purpose of the present collector system to selectively collect only those backscattered electrons (low-loss electrons) with energies within a narrow energy range such as electrons within region 62 of approximately 100–200 eV in width.

The electric field potentials applied to grids 26, 28 and 30 determine the energy range of the collected electrons. In order to selectively collect low-loss electrons having a narrow-energy range (such as those in region 62 of FIG. 3), the following electric potentials are applied to the collector system: a low negative potential of approximately $-20$ v to $-200$ v is applied to the first grid 26; a negative potential approximately equal to the accelerating potential ($E_B = 10$ KV to 15 KV) or slightly less negative (50–100 eV) than the accelerating potential is applied to the second grid 28; a potential approximately equal to the potential of the second grid 28 or a potential slightly more negative (50–100 eV) than the accelerating potential is applied to the third grid 30; and the scintillator 42 is held at ground. The total window for acceptance of low-loss electrons is therefore 100–200 eV.

Figure 4:
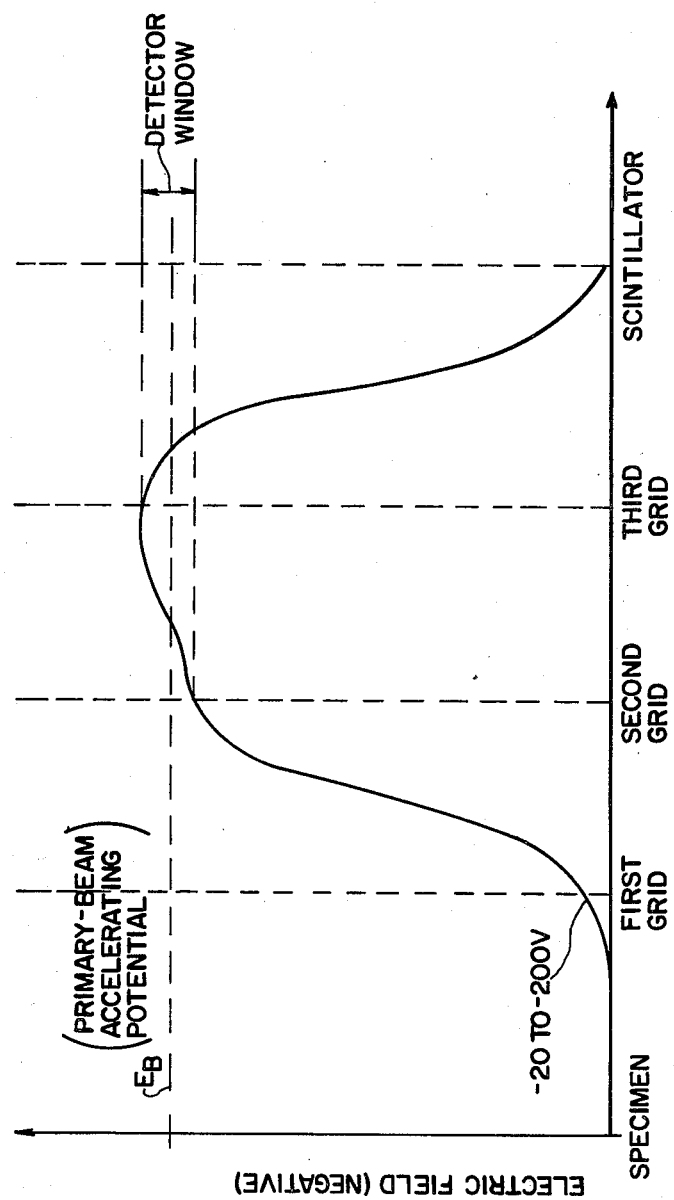
FIG. 4 illustrates the electric field distribution when the present invention is biased to collect low-loss electrons.

FIG. 4 illustrates the electric fields in the collector system when the grids and scintillator are biased in the foregoing manner. The grids are disposed so that the field gradient does not change sign in the region between the grids. Since the fields provided by the biasing potential decrease proportionally to the distance from the grid, the distance between the grids is chosen to maintain the field gradient between grids at a constant magnitude and sign. A separation between the grids of from 2.5 to 4 mm has been found to be satisfactory for use with biasing potentials in the range previously described. The energy range of the electrons which are permitted to pass through grids and strike the scintillator (i.e., the window of the collector) is determined by the difference between potentials on the second grid 28 and the third grid 30. The first grid 26 when biased at the low negative potential provides a constantly decreasing field between the first and second grids and serves to counter the uneven fields which result from positive potentials which may be associated with other components of the scanning beam system. The low-loss detector will therefore accept electrons which have suffered an energy loss of only 100–200 eV. This indicates that only surface or near surface scattered electrons will be collected.

The collector system 24 may be used to collect secondary electrons when the proper biasing potentials are applied. In this case the first grid 26 will be biased at approximately $+200$ V while the second and third grids 28 and 30 will be maintained at ground or at slightly positive potential. The scintillator 42 is preferably biased at approximately 2 kV in order to accelerate the secondary electrons after they pass through the third grid 30.

Obviously many modifications and variations of the present invention are possible in light of the above teachings. It is therefore to be understood that within the scope of the appended claims the invention may be practiced otherwise than as specifically described.

What is claimed and desired to be secured by Letters Patent of the United States is:

1. In a device wherein a primary electron beam accelerated by a specific accelerating potential is scanned over the surface of a specimen and electron images are generated by collecting electrons scattered from the surface, an improved collector system for selectively collecting backscattered low-loss electrons having energies within a selectable energy range comprising:

electron-responsive means positioned in the path of the backscattered electrons for producing a signal when struck by an electron;

first grid means, positioned between said specimen and said electron-responsive means in the path of the backscattered electrons, for establishing a first negative electric field potential having a magnitude near ground potential in the path of the backscattered electrons;

second grid means, positioned between said first grid means and said electron-responsive means in the path of the backscattered electrons, for establishing a second negative electric field potential in the path of the backscattered electrons, said second electric field potential being approximately equal in magnitude to the energy of the lowest energy electrons to be collected; and third grid means, positioned between said second grid means and said electron-responsive means in the path of the backscattered electrons, for establishing a third negative electric field potential in the path of the backscattered electrons, said third electric field potential being approximately equal in magnitude to the energy of the highest energy electrons to be collected.

2. The collector system as recited in claim 1 wherein said first, second, and third grids are formed from an electrically conducting mesh.

3. The collector system as recited in claim 2 wherein said first, second, and third grids are similarly shaped.

4. The collector system as recited in claim 3 wherein said first, second, and third grids are curvilinear in shape.

5. The collector system as recited in claim 1 wherein said second grid means establishes a negative electric field potential having a magnitude near to but less negative than the accelerating potential of said primary beam;

said third grid means establishes a negative electric field potential having a magnitude near to but more negative than the accelerating potential of said primary beam; and said electron responsive means is at ground potential, whereby said collector system will selectively collect low-loss electrons having energies between the potentials established by said second grid means and said third grid means.

6. The collector system as recited in claim 1 wherein said first grid means establishes a negative electric field potential of approximately 20 volts to 200 volts with respect to ground potential;

said second grid means establishes a negative electric field potential with respect to ground potential of approximately 50 volts to 100 volts less negative than the accelerating potential of said primary electrons beam;

said third grid means establishes a negative electric field potential with respect to ground potential of approximately 50 to 100 volts more negative than the accelerating potential of said primary electron beam; and said electron-responsive means is at ground potential, whereby said collector system will selectively collect low-loss electrons having energies between the potentials established by said second grid means and said third grid means.

7. The collector system as recited in claim 1, 5 or 6 wherein said second grid means is positioned so that gradient of the electric field between said first grid means and said second grid means is of constant sign; and said third grid means is positioned so that the gradient of the electric field between said second grid means and said third grid means is of constant sign.

8. The collector system of claim 1 wherein said electron-responsive means comprises:

a scintillator means for producing a signal when struck by an electron;

a first layer of a refractory metal formed on said scintillator means; and a second layer of a noble metal formed on said first layer.

9. The collector system of claim 8 wherein said first layer comprises a layer of tantalum and said second layer comprises a layer of gold.

10. The collector system of claim 9 wherein said first layer is approximately 100 Å to 300 Å in thickness and the second layer is approximately 1000 Å in thickness.

* * * * *